United States Patent
Humphrey

(10) Patent No.: US 6,710,617 B2
(45) Date of Patent: Mar. 23, 2004

(54) VARIABLE SLEW RATE CONTROL FOR OPEN DRAIN BUS

(75) Inventor: Guy Harlan Humphrey, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 2 days.

(21) Appl. No.: 10/044,092

(22) Filed: Jan. 10, 2002

(65) Prior Publication Data

US 2003/0128047 A1 Jul. 10, 2003

(51) Int. Cl.[7] ............................................. A03K 19/003

(52) U.S. Cl. ............................. 326/30; 326/26; 326/27

(58) Field of Search ........................ 326/26, 27, 30–34, 326/82, 83, 87, 90

(56) References Cited

U.S. PATENT DOCUMENTS

| | | | | |
|---|---|---|---|---|
| 5,170,073 A | * | 12/1992 | Hahn et al. | 307/270 |
| 5,923,183 A | * | 7/1999 | Kim et al. | 326/27 |
| 6,281,729 B1 | | 8/2001 | Ang et al. | |
| 6,288,563 B1 | | 9/2001 | Muljono et al. | |
| 6,295,572 B1 | * | 9/2001 | Wu | 710/131 |
| 6,297,677 B1 | | 10/2001 | Ang et al. | |

\* cited by examiner

*Primary Examiner*—Anh Tran

(57) ABSTRACT

A method and circuit for controlling the slope of a transitioning signal on a transmission line of integrated circuit is achieved using stepwise pull-down impedance reduction/augmentation. Over a series of sequentially ordered steps, a predetermined decreasing (or increasing) impedance is connected between the transmission line and voltage source. Using certain predetermined impedance values in order, a linear slew rate on the output signal is achievable. Adjusting the time delay between each step allows the slope of the linear slew rate to be adjusted.

25 Claims, 6 Drawing Sheets

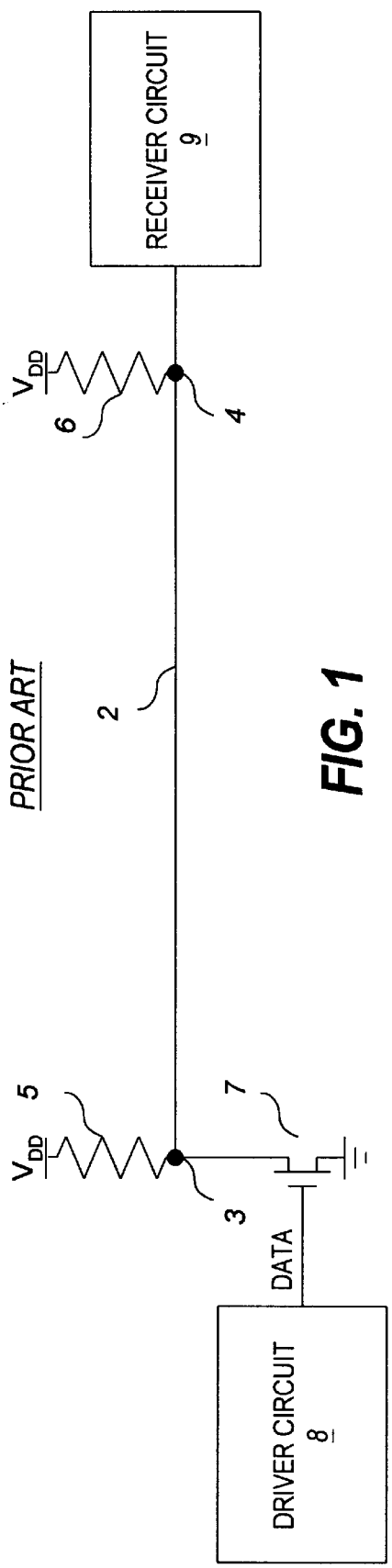
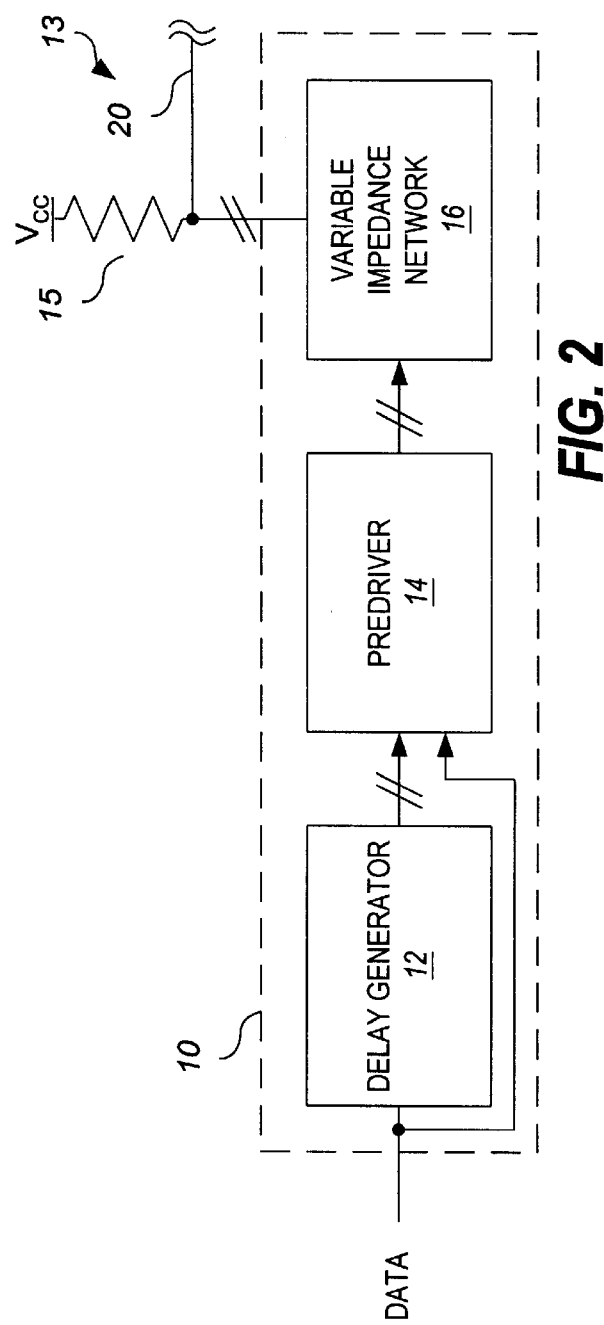
*FIG. 1* PRIOR ART
*FIG. 2*

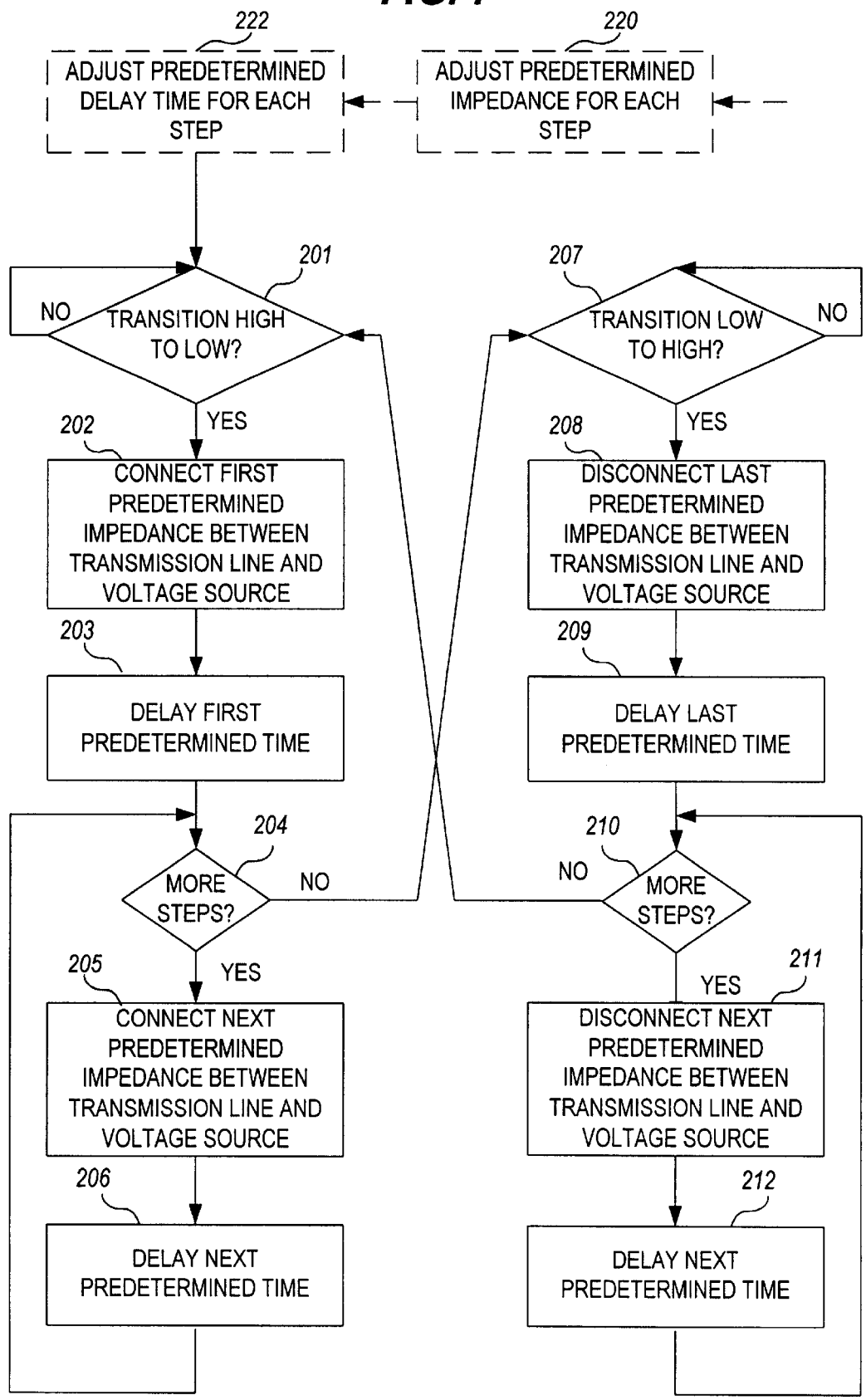

VARIABLE SLEW RATE CONTROL FOR OPEN DRAIN BUS

FIELD OF THE INVENTION

The present invention pertains generally to transmission lines in integrated circuits, and more particularly to a method and circuit for controlling the slew rate of a transitioning signal on a node of integrated circuit using stepwise impedance reduction/augmentation.

BACKGROUND OF THE INVENTION

Integrated circuits provide communication using digital signals. In the digital world, a digital signal may be in one of a plurality of predefined quantized states. Because digital signals are transmitted using an analog signal along a transmission line, the predefined quantized states of the digital signal are represented by different ranges of voltages within the total voltage range of the signal. For example, a typical digital integrated circuit (IC) based on a binary system will communicate using two states—zero ("0") or LOW, and one ("1") or HIGH. The digital state of "0" is represented by the range of voltages between a minimum voltage $V_{MIN}$ (e.g., 0 volts) of the potential voltage range of the signal and a voltage $V_{LOW}$ that is low relative to the total range of voltage, whereas the digital state of "1" is represented by the range of voltages between a voltage $V_{HIGH}$ that is high relative to the total range of voltages and a maximum voltage $V_{MAX}$ (e.g., 1.5 volts) of the potential voltage range of the signal. In the binary system example, the state of the digital signal is unknown when the voltage level of the signal is between $V_{LOW}$ and $V_{HIGH}$. This unknown state typically occurs only during transitions of the signal from either the "0" state to the "1" state or vice versa.

At the integrated circuit level, a signal trace takes on the characteristics of a transmission line. Because the transmission signal is actually analog, the transition between digital states does not occur instantaneously, but instead occurs over a period of time $T_{TRANSITION}$ that is dependent on the physical conditions present on the transmission line. It is well known that signal transitions over a transmission line will suffer a delay known as a propagation delay due to the parasitic resistance, inductance, and capacitance of the line. This delay increases with the length of the line. In addition, it is also well-known that unless the impedance of the transmission line matches that of the load it drives, the signal will degrade. Signal degradation of this type occurs because the mismatch in impedance causes reflections from the load that are passed back to the driver circuit. These reflections may then be re-reflected by the driver circuit, causing further signal degradation.

It is also known that when a driver circuit drives multiple loads with differing impedances, the transmission line requires multiple stubs to properly match each of the loads during realtime operation. However, the use of multiple stubs then generates multiple reflections.

One way of ensuring proper detection of signal states is to slow the slew rates of the signal. The slew rate is the slope at which the signal edges transition between non-floating states.

SUMMARY OF THE INVENTION

The present invention is a novel method and circuit for controlling the slope of a transitioning signal on a node of integrated circuit using stepwise impedance reduction/augmentation. The invention allows precise control over the slew rate of the signal, which thereby allows matching of the transition times on both the rising and falling edges of the signal. In accordance with the method of the invention, an open drain node displaying transmission line characteristics is pulled from a first state to a second state over a plurality of sequentially ordered steps. At each step, a predetermined decreasing (or increasing) impedance is connected between the node and a voltage source representing the second state. Preferably, the order of the predetermined impedances decrease (or increase) non-linearly such that said signal transition seen on the node results in a linear slew rate. When the output signal is to transition from the high state to the low state, the pulldown driver decreases the impedance between the node and voltage source in an ordered stepwise manner. When the output signal is to transition from the low state to the high state, the pulldown driver increases the impedance between the node and low voltage source in reverse order stepwise manner.

In accordance with one embodiment of the invention, a plurality of serially connected variable delay units generates a plurality of delayed versions of the data signal to be driven onto the transmission line. When the output signal is to be pulled to a given state, a predriver circuit programs a variable impedance network to connect a different one of a plurality of predetermined impedances in ascending or descending order between the node and a voltage source once for each delayed version of transitioned data signal. The shape of the transition edges may be precisely shaped through a combination of the selection of the number of steps, impedance values for each step, and time delay between each step. In one embodiment, the values of the predetermined impedances in order of their connection between the node and voltage source is non-linear to result in a linear slew rate of a resulting output signal on the node.

Preferably, the delay time between each step is equal so as to allow the slew rate to be adjusted without affecting the linearity of the slew rate. This also allows slew rate adjustment by a PVT control circuit to account for process, voltage, and temperature variations in the components of the integrated circuit.

BRIEF DESCRIPTION OF THE DRAWING

The invention will be better understood from a reading of the following detailed description taken in conjunction with the drawing in which like reference designators are used to designate like elements, and in which:

FIG. 1 is a schematic block diagram of an open-drain transmission line implemented in accordance with the invention;

FIG. 2 is a block diagram of a conventional open-drain transmission line;

FIG. 7 is an operational flowchart of the method of the invention.

DETAILED DESCRIPTION

Figure 3:
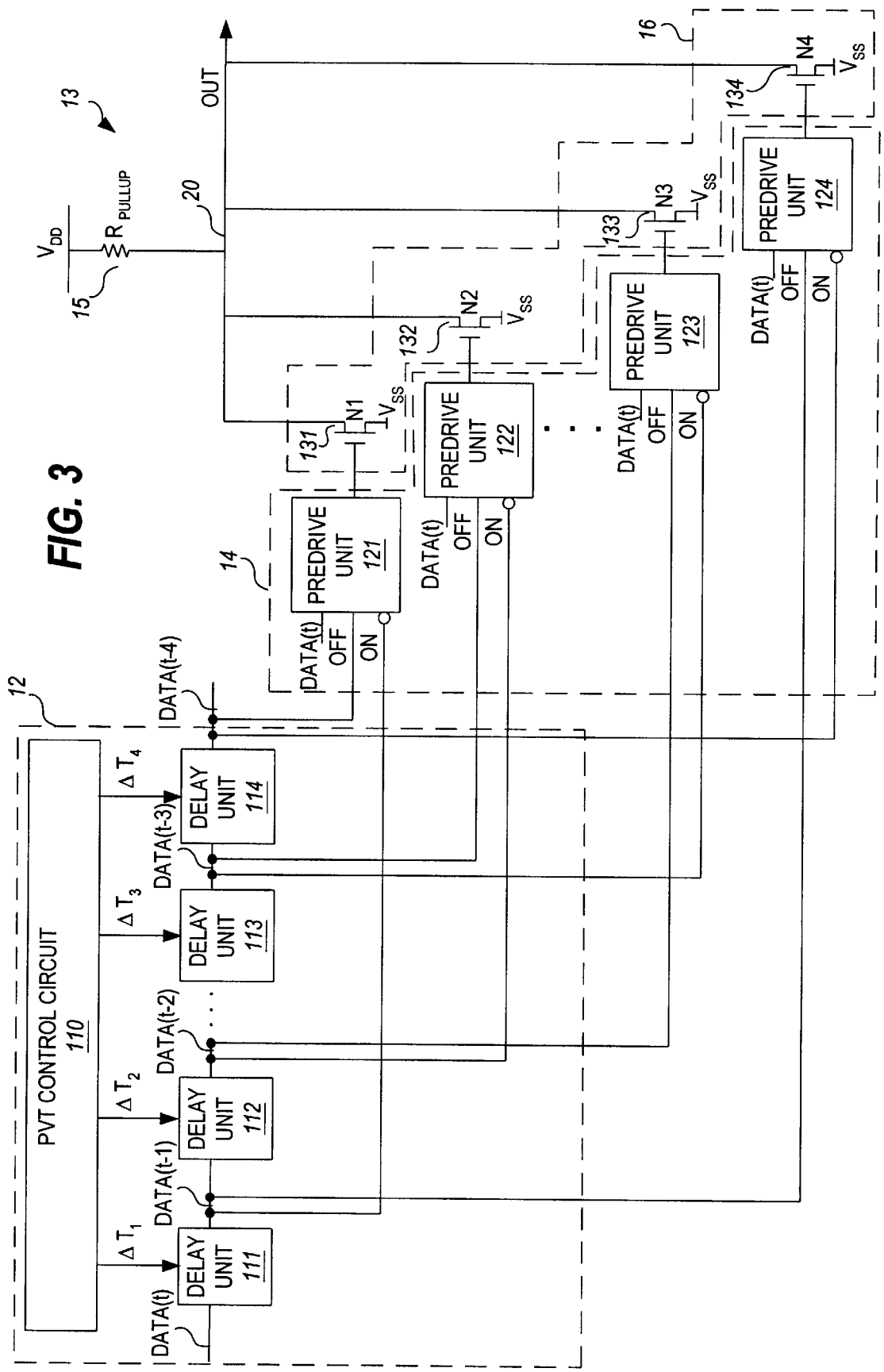
FIG. 3 is a schematic diagram of a slew rate control circuit implemented in accordance with the invention.

A novel method and system for controlling the slew rate of a signal on a node of an integrated circuit is described in detail hereinafter. Although the invention is described in terms of specific illustrative embodiments, it is to be understood that the illustrative embodiments are shown by way of example only and that the scope of the invention is not intended to be limited thereby. For example, although the illustrative embodiment uses a plurality of CMOS field effect transistors (FETs) to implement the resistive devices switchably connectable to the output node, these devices may be implemented using various other known alternatives.

Turning now to FIG. 1, there is shown a block diagram illustrating a conventional open-drain transmission line 2. As known in the art, an open-collector transmission line is terminated on both the driver end 3 and receiver end 4 with respective pull-up resistors 5 and 6. More specifically, pull-up resistor 5 is connected at driver end 3 between the transmission line 2 and a HIGH voltage source $V_{DD}$, while pull-up resistor 6 is connected at receiver end 4 between the transmission line 2 and a HIGH voltage source $V_{DD}$. In an open-drain transmission line, the pull-up resistors 5 and 6 operate to maintain the transmission line 2 in a HIGH state unless actively pulled to a LOW state. This is achieved using a transistor device, such as n-channel MOSFET (hereinafter NFET) 7. In particular, the source of NFET 7 is connected to a LOW voltage source (such as ground) and the drain of NFET 7 is connected to the transmission line 2. The NFET 7 is switched on or off via a DATA signal connected to the gate of NFET 7 to respectively sink current from the line 2 (thereby pulling transmission line 2 to a LOW state) or to isolate the transmission line 2 from the LOW voltage source (thereby allowing the pull-up resistors 5 and 6 to pull the transmission line 2 to a HIGH state).

FIG. 2 is a block diagram illustrating a driving end 13 of an open-drain transmission line 20 driven by a driver circuit 10 implemented in accordance with the invention. (For simplicity, the receiving end of the transmission line 20 is not shown.) In particular, the driver circuit 10 allows slew rate control of a signal DATA driven onto the transmission line 20 using stepwise pull-down impedance reduction/augmentation. In particular, if the signal DATA is transitioning from a HIGH state to a LOW state, the pull-down impedance, implemented by variable impedance network 16, is gradually decreased over a plurality of delayed steps. In contrast, if the signal DATA is transitioning from a LOW state to a HIGH state, the pull-down impedance is gradually increased over a plurality of delayed steps.

As illustrated, in the preferred embodiment the driver circuit 10 includes a delay generator circuit 12, a predriver circuit 14, and a variable impedance network 16 that may be programmed to switchably connect various pull-down impedances between the transmission line 20 and a LOW voltage source. Delay generator 12 receives a signal DATA to be driven onto the transmission line 20 and produces a plurality of successive delayed versions of the signal DATA. Predriver circuit 14 implements a state machine that receives the signal DATA along with the plurality of successive delayed versions of the signal DATA, and selectively programs the variable impedance network 16 to decrease or increase the pull-down impedance in a stepwise manner depending on whether the signal DATA is transitioning from a HIGH state to a LOW state or from a LOW state to a HIGH state.

To more particularly describe the structure and operation of the driver circuit 10, reference is now made to FIG. 3, which illustrates this circuitry in more detail. Specifically, variable impedance network 16 comprises a plurality of resistive devices 131, 132, 133, 134, each switchably connectable between the driven end 13 of the transmission line 20 and a LOW voltage source $V_{SS}$ (e.g., ground). In the preferred embodiment, the resistive devices 131, 132, 133, 134 are implemented using n-channel FETs N1, N2, N3, N4, each having a source connected to the LOW voltage source $V_{SS}$ and a drain connected to the transmission line 20, and each separately controllable at a gate input to electrically connect the transmission line 20 to the LOW voltage source $V_{SS}$ or to isolate the transmission line 20 from the LOW voltage source $V_{SS}$.

Delay generator 12 comprises a plurality of serially connected delay units 111, 112, 113, 114. Each delay unit 111, 112, 113, 114 outputs a respective delayed version DATA(t-1), DATA(t-2), DATA(t-3), DATA(t-4) of its input. Delay unit 111 is connected to receive the signal DATA(t) to be driven onto the transmission line 20. Each successive delay unit 112, 113, 114 in the series of delay units is connected to receive the output of its immediate predecessor delay unit in the series. Thus, delay unit 112 is connected to receive the output DATA(t-1) of delay unit 111 (i.e., the delayed version of signal DATA(t), delay unit 113 is connected to receive the output DATA(t-2) of delay unit 112, and so on. In the present example, then, the last delay unit 114 is connected to receive the delayed output of its immediate predecessor delay unit 113.

Predriver circuit 14 is a state machine that receives the current state of the signal DATA(t) and the outputs DATA (t-1), DATA(t-2), DATA(t-3), DATA(t-4) of each delay unit. Depending on the direction of the signal transition, predriver circuit 14 controls the variable impedance network 16 to electrically connect or isolate different combinations of the resistive devices 131, 132, 133, 134. More specifically, depending on the direction of signal transition, predriver circuit 14 programs the variable impedance network 16 to decrement or increment the pull-down impedance in a stepwise manner in order to control the slew rate of the signal OUT driven onto the transmission line 20.

In the preferred embodiment, predriver circuit 14 comprises a plurality of individual predrive units 121, 122, 123, 124 each for controlling the electrical connection or isolation of a different respective resistive device 131, 132, 133, 134 in the variable impedance network 16. In the preferred embodiment, when signal DATA transitions from a HIGH state to a LOW state, each predrive unit 121, 122, 123, 124 turns on its corresponding NFET N1, N2, N3, N4 one after another in delayed succession. Once an NFET has been switched on, it remains on until turned off in reverse succession by its respective predrive unit when the signal DATA transitions from a LOW state to a HIGH state.

In particular, the transmission line 20 is electrically connected to or isolated from the LOW voltage source $V_{SS}$ according to a plurality of delayed decremental or incremental pull-down impedance steps. This is achieved by selectively electrically connecting/disconnecting different combinations of the resistive devices 131, 132, 133, 134 in an ordered manner to achieve a desired shape of the transition edge of the driven signal.

The slew rate and shape of the signal OUT driven onto the transmission line 20 is determined by a number of design factors, including the number of delayed steps, the amount of pulldown resistance increased or decreased at each step, and the amount of delay ΔT between each step. In design, the number of steps chosen and signal frequency will typically dictate the amount of delay between each step, particularly if it is desired to have a constant delay time ΔT between each step. The desired shape of the signal's transition edges will then dictate the amount of pulldown resistance required at each step, according to the following calculations:

The voltage $V_{TL}$ on transmission line 20 may be defined as:

$$V_{TL}=VDD*(R_{pulldown}/R_{pulldown}+R).$$

Upon selection of the number of steps, delay time ΔT between each step, and signal transition edge shape chosen, the desired transmission line voltage values $V_{TL}$ may then be determined for each step. Those skilled in the art will appreciate that more control over the signal shape is achieved using more steps.

Figure 4:
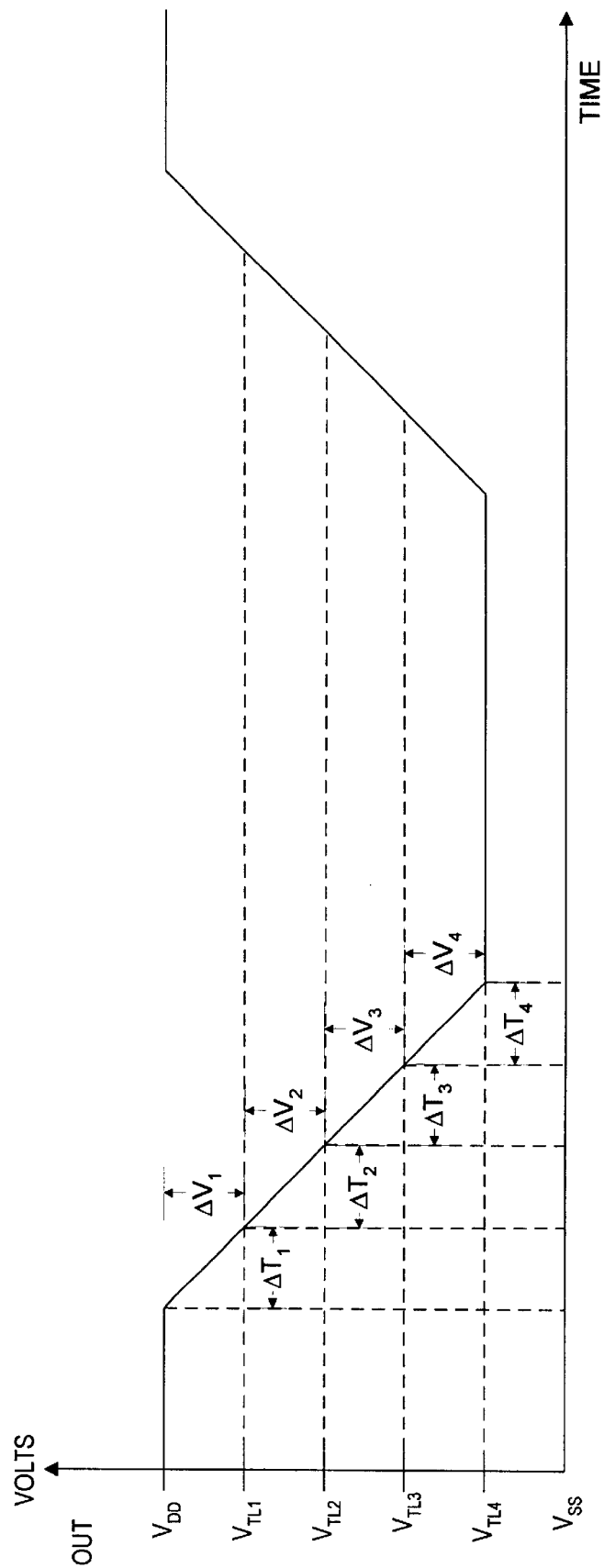
FIG. 4 is a timing diagram illustrating the slew rate control of a data signal using the slew rate control circuit of FIG. 3.

Referring to FIG. 4 as an illustrative example, suppose that the designer desires to achieve a signal shaped as shown by signal OUT. As illustrated, in this example, the desired shape of the rising and falling signal transition edges of the signal OUT are linear with respect to time (i.e., the slew rate is constant) and the slew rate control is to be achieved over four steps. Suppose further that, for simplicity of design, a constant delay ΔT between each step is selected for each delay time $ΔT_1$, $ΔT_2$, $ΔT_3$, $ΔT_4$. With these selections made, the desired transmission line voltage values $V_{TL\_1}$, $V_{TL\_2}$, $V_{TL\_3}$, and $V_{TL\_4}$ may then be determined. In this case, in order to achieve the desired linear slope on the signal transitions, the transmission line voltage values $V_{TL\_1}$, $V_{TL\_2}$, $V_{TL\_3}$, and $V_{TL\_4}$ are also selected linearly spaced. Accordingly, if, for example, $V_{DD}$ has a value of 1.0 Volts and $V_{SS}$ has a value of 0 Volts, the desired values of the transmission line voltage over four steps is as follows: $V_{TL\_1}$ will be 0.8 Volts, $V_{TL\_2}$ will be 0.6 Volts, $V_{TL\_3}$ will be 0.4 Volts, and $V_{TL\_4}$ will be 0.2 Volts.

With the selected transmission line voltage values $V_{TL\_1}$, $V_{TL\_2}$, $V_{TL\_3}$, and $V_{TL\_4}$, the pulldown resistance required for each step may be determined. In particular, the voltage $V_{TL}$ on transmission line 20 may be defined as:

$$V_{TL}=V_{DD}*(R_{pulldown}/R_{pulldown}+R).$$

From this equation, the combined resistance of each combination of pulldown resistive devices may be calculated as follows:

$$R_{pulldown\_n}=(R*V_{TL\_n})/(V_{DD}-V_{TL\_n}).$$

TABLE 1 illustrates the calculated values for $R_{pulldown\_n}$ for $V_{DD}$=1.0 Volts, and $R_{pullup}$=50 Ohms.

TABLE 1

| $V_{TL\_n}$ | Volts | $R_{pulldown\_n}$ | Ohms |
|---|---|---|---|
| $V_{TL\_1}$ | 0.8 | $R_{pulldown\_1}$ | 200 |
| $V_{TL\_2}$ | 0.6 | $R_{pulldown\_2}$ | 75 |
| $V_{TL\_3}$ | 0.4 | $R_{pulldown\_3}$ | 33 |
| $V_{TL\_4}$ | 0.2 | $R_{pulldown\_4}$ | 12.5 |

In the embodiment of FIG. 3, resistive devices 131, 132, 133, 134 are implemented with n-channel FETs N1, N2, N3, and N4. In this embodiment, the first FET N1 in the series of FETs N1, N2, N3, and N4 is turned on with the first step. Once a FET is turned on, it remains on until turned off when the signal transitions to the opposite state, and vice versa. Accordingly, at the second step, FET N1 remains on, and the next FET N2 in the series of FETS N1, N2, N3, and N4 is turned on. At the third step, FETs N1 and N2 remain on, and the next FET N3 in the series is turned on. At the fourth step, FETs N1, N2, and N3 remain on, and the next FET N4 in the series is turned on.

In this design, the pull-down resistance for each of the four steps may be derived as follows:

Since the admittance Y is defined as Y=1/R, then it follows that:

$$Y_{pulldn\_1}=Y_{N1}$$

$$Y_{pulldn\_2}=Y_{N1}+Y_{N2}$$

$$Y_{pulldn\_3}=Y_{N1}+Y_{N2}+Y_{N3}$$

$$Y_{pulldn\_4}=Y_{N1}+Y_{N2}+Y_{N3}+Y_{N4}.$$

The admittance value $Y_N$ of each FET N1, N2, N3, N4 of FIG. 3 may be derived from the above equations as:

$$Y_{N1}=Y_{pulldn\_1}$$

$$Y_{N2}=Y_{pulldn\_2}-Y_{pulldn\_1}$$

$$Y_{N3}=Y_{pulldn\_3}-Y_{pulldn\_2}$$

$$Y_{N4}=Y_{pulldn\_4}-Y_{pulldn\_3},$$

and therefore:

$$R_{N1}=1/Y_{N1},$$

$$R_{N2}=1/Y_{N2},$$

$$R_{N3}=1/Y_{N3},$$

and $$R_{N4}=1/Y_{N4}.$$

Accordingly, using the values from TABLE 1, in this example:

$$R_{N1}=200 \text{ Ohms},$$

$$R_{N2}=120 \text{ Ohms},$$

$$R_{N3}=60 \text{ Ohms},$$

and $$R_{N4}=20 \text{ Ohms}.$$

It will be appreciated by those skilled in the art that the shape of the signal OUT driven onto transmission line 20 may be controlled by varying the number of steps, the delay amount between each step, and the pulldown impedance defined for each step.

As previously described, each of the resistive devices 131, 132, 133, 134 in the variable impedance network 16 is separately controllable to electrically connect, or to electrically isolate, the transmission line 20 to or from the LOW voltage source. Predriver circuit 14 controls the connection or isolation of each resistive device 131, 132, 133, 134 to or from the transmission line 20.

Figure 5:
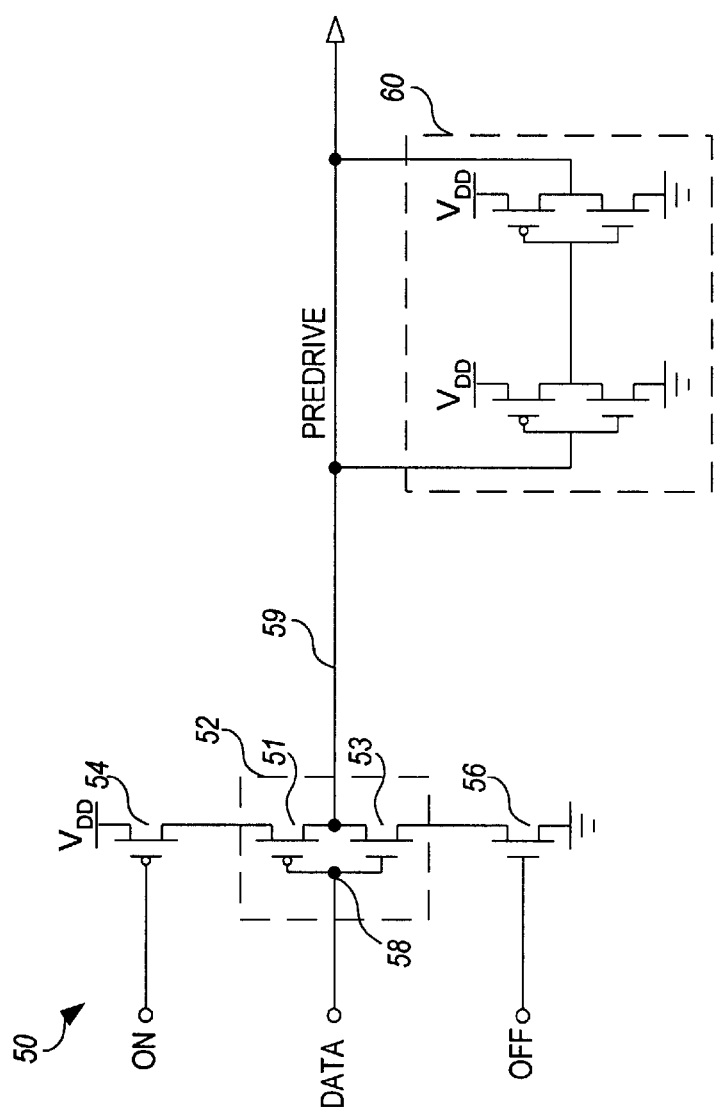
FIG. 5 is a schematic diagram of a pre-driver circuit used for the predrive units in the slew rate control circuit of FIG. 3.

FIG. 5 is a schematic diagram of an example implementation of an individual predrive unit 50 used to implement predrive units 121, 122, 123, and 124 of FIG. 3. As illustrated, predrive unit 50 comprises a CMOS inverter 52 having an input 58 connected to receive the signal DATA to be driven onto the transmission line 20, and an output 59 connected to control the connection or non-connection of the resistive device 131, 132, 133, or 134 associated with the particular predrive unit 50. The CMOS inverter 52 comprises a p-channel MOSFET 51 (hereinafter PFET) having a drain connected to the transmission line 20 and a source switchably connected to a HIGH voltage source $V_{DD}$ through a switch PFET 54, and an NFET 53 having a drain connected to the transmission line 20 and a source switchably connected to a LOW voltage source $V_{SS}$ through a switch NFET 56. Each of the drains of inverter PFET 51 and inverter NFET 53 is connected to receive the signal DATA.

The switch PFET 54 has a drain connected to the source of inverter PFET 51 and a source connected to the HIGH voltage source $V_{DD}$. Switch PFET 54 has a gate connected to receive an ON input, which as discussed hereinafter is one of the delayed versions of the signal DATA. The switch NFET 56 has a drain connected to the source of inverter NFET 53 and a source connected to the LOW voltage source $V_{SS}$. Switch NFET 56 has a gate connected to receive an OFF input, which as also discussed hereinafter is a different one of the delayed versions of the signal DATA. TABLE 2 is a state table illustrating the logic operation of the predrive unit 50.

TABLE 2

| DATA | OFF | ON | PREVIOUS OUTPUT | OUTPUT |
|---|---|---|---|---|
| Case 1: | | | | |
| 1 | 1 | 1 | X | 0 |
| 0 | 1 | 1 | 0 | 0 |
| 0 | 0 | 1 | 0 | 0 |
| 0 | 0 | 0 | 0 | 1 |
| 1 | 0 | 0 | 1 | 1 |
| 1 | 1 | 0 | 1 | 0 |
| 1 | 1 | 1 | 0 | 0 |
| Case 2: | | | | |
| 1 | 1 | 1 | X | 0 |
| 0 | 1 | 1 | 0 | 0 |
| 0 | 1 | 0 | 0 | 1 |
| 0 | 0 | 0 | 1 | 1 |
| 1 | 0 | 0 | 1 | 1 |
| 1 | 0 | 1 | 1 | 1 |
| 1 | 1 | 1 | 1 | 0 |

Predrive unit 50 also may include an optional weak holder circuit 60, comprising back-to-back inverters, connected to the predrive unit output 59, which holds the state on the predrive unit output 59 to prevent the output 59 from floating to an intermediate voltage when the predrive unit 50 is not actively driven to output one voltage state or another.

Referring again to FIG. 3, with the resistance values of FETS N1, N2, N3, and N4 defined as above, the predrive units 121, 122, 123, and 124 are connected in a manner such that when the signal DATA transitions from a HIGH state to a LOW state, the FETS N1, N2, N3, and N4 are turned on (to conduct current between the transmission line 20 and LOW voltage source $V_{SS}$) in the following order: Step 1–N1 turns on; Step 2–N1 remains on and N2 turns on; Step 3–N1 and N2 remain on and N3 turns on; Step 4–N1, N2, N3 remain on and N4 turns on.

Similarly, the predrive units 121, 122, 123, and 124 are also connected in a manner such that when the signal DATA transitions from a LOW state to a HIGH state, the FETS N1, N2, N3, and N4 are turned off (to isolate the transmission line 20 from the LOW voltage source $V_{SS}$) in the following order: Step 1–N4 turns off while N1, N2, N3 remain on; Step 2 N3 turns off while N1 and N2 remains on; Step 3–N2 turns off while N1 remains on; Step 4–N1 turns off.

In order to achieve the above ordered turning on and turning off of the NFETs N1, N2, N3, N4, the output of first delay unit 111 in the series of delay units is connected to the ON input of first predrive unit 121 that drives the highest impedance FET N1, and the output of last delay unit 114 in the series of delay units is connected to the OFF input of predrive unit 121. The output of the next delay unit 112 in the series is connected to the ON input of the next predrive unit 122 that drives the next highest impedance FET N2, and the output of the next-to-last delay unit 113 in the series is connected to the OFF input of the predrive unit 122. The output of the next delay unit 113 in the series is connected to the ON input of the next predrive unit 123 in the series that drives the next highest impedance FET N3, and the output of the delay unit 112 in the series is connected to the OFF input of the predrive unit 123. The output of the last delay unit 114 in the series is connected to the ON input of the last predrive unit 124 that drives the lowest impedance FET N4, and the output of the delay unit 111 in the series is connected to the OFF input of the predrive unit 124.

Figure 6:
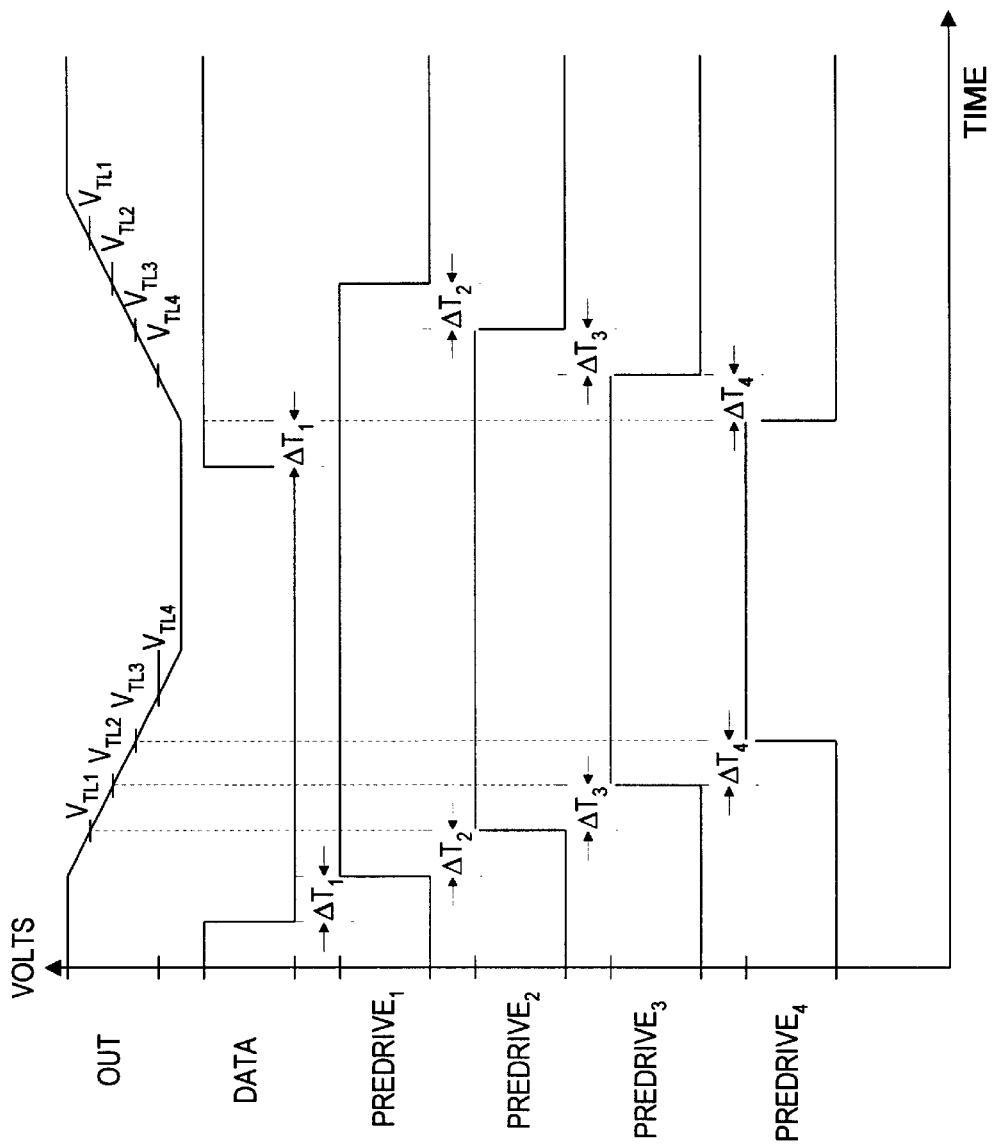
FIG. 6 is a timing diagram illustrating the relationships between the data signal, predrive signals, and output signal.

Referring now to the timing diagram shown in FIG. 6, in conjunction with the preferred embodiment driver circuit of FIG. 3, in operation, assuming all of the FETs N1, N2, N3, N4 begin in the off state and the signal DATA is in the HIGH state, the signal OUT on the transmission line 20 is pulled to a HIGH state by pullup resistor 15. When the signal DATA transitions from the HIGH state to the LOW state, after a delay time $\Delta T_1$, the negative true ON input of predrive unit 121 will go LOW, thereby enabling the switch PFET 51 (see FIG. 5) of the predrive unit 121 to connect the source of inverter PFET 51 to the HIGH voltage source $V_{DD}$. This drives the PREDRIVE signal of the predrive unit 121 (PREDRIVE$_1$) to the HIGH state, thereby turning on FET N1. Meanwhile, as shown in FIG. 6, predrive signals PREDRIVE$_2$, PREDRIVE$_3$, and PREDRIVE$_4$ remain in the LOW state, and therefore FETs N2, N3, and N4 remain off.

After the passage of another delay time $\Delta T_2$, the LOW state of the signal DATA propagates through the second delay unit 112, and the negative true ON input of predrive unit 122 will go LOW. This will cause the PREDRIVE signal of the predrive unit 122 (PREDRIVE$_2$) to go to the HIGH state, thereby turning on FET N2. Meanwhile, as shown in FIG. 6, predrive signals PREDRIVE$_3$ and PREDRIVE$_4$ remain in the LOW state, and therefore FETs N3, and N4 remain off.

After the passage of a further delay time $\Delta T_3$, the LOW state of the signal DATA propagates through the third delay unit 113, and the negative true ON input of predrive unit 123 will go LOW. This will cause the PREDRIVE signal of the predrive unit 123 (PREDRIVE$_3$) to go to the HIGH state, thereby turning on FET N3. Meanwhile, as shown in FIG. 6, predrive signal PREDRIVE$_4$ remains in the LOW state, and therefore FET N4 remains off.

After the passage of yet a further delay time $\Delta T_4$, the LOW state of the signal DATA propagates through the fourth delay unit 114, and the negative true ON input of predrive unit 124 will go LOW, causing the PREDRIVE signal of predrive unit 124 (PREDRIVE$_4$) to go to the HIGH state, turning on FET N4.

All four FETs N1, N2, N3, N4 remain on until the signal DATA makes a transition from the LOW state to the HIGH state. When this happens, after a delay time $\Delta T_4$, the OFF input of predrive unit 124 will go HIGH, thereby enabling the switch NFET 53 (see FIG. 5) of predrive unit 124 to connect the source of inverter NFET 53 to the LOW voltage source $V_{SS}$. This drives the PREDRIVE$_4$ signal of predrive unit 124 to the LOW state, thereby turning off FET N4. Meanwhile, as shown in FIG. 6, predrive signals PREDRIVE$_3$, PREDRIVE$_2$, and PREDRIVE$_1$ remain in the HIGH state, and therefore FETs N3, N2, and N1 remain on.

After the passage of another delay time $\Delta T_3$, the HIGH state of the signal DATA propagates through the second delay unit 112, and the OFF input of predrive unit 123 will go HIGH. This will cause the PREDRIVE$_3$ signal of predrive unit 123 to go to the LOW state, thereby turning off FET N3. Meanwhile, as shown in FIG. 6, predrive signals PREDRIVE$_2$ and PREDRIVE$_1$ remain in the HIGH state, and therefore FETs N2, and N1 remain on.

After the passage of a further delay time $\Delta T_2$, the HIGH state of the signal DATA propagates through the third delay unit 113, and the OFF input of predrive unit 122 will go HIGH. This will cause the PREDRIVE$_2$ signal of predrive unit 122 to go to the LOW state, thereby turning off FET N2. Meanwhile, as shown in FIG. 6, predrive signal PREDRIVE$_1$ remains in the HIGH state, and therefore FET N1s remain on.

After the passage of yet a further delay time $\Delta T_1$, the HIGH state of the signal DATA propagates through the fourth delay unit 114, and the OFF input of predrive unit 121 will go HIGH. This will cause the PREDRIVE$_1$ signal of predrive unit 121 to go to the LOW state, thereby turning off FET N1.

It will be appreciated that the shape of the edge transitions of the output signal OUT may be precisely controlled by selecting an appropriate number of steps and setting appropriate values for each of the pulldown impedance and time delay $\Delta T_1$, $\Delta T_2$, $\Delta T_3$, $\Delta T_4$ associated with each step. Thus, if it were desirable to have a non-linear edge transition, the designer could vary the time delay $\Delta T_1$, $\Delta T_2$, $\Delta T_3$, $\Delta T_4$ between each step and/or the pulldown impedance connected at each step.

It will also be appreciated that the use of a constant time delay $\Delta T$ between each pulldown impedance change step allows one to change the slew rate of the driven signal DATA merely by changing the value of the constant $\Delta T$. By using a variable delay unit whose delay time $\Delta T$ is programmable, the delay units 111, 112, 113, 114 can be programmed by a PVT control circuit 110 to adjust the delay to the PVT parameters of the circuit. This feature allows precise slew rate control across circuits that may vary in performance due to differences in PVT parameters. Depending on the implementation of the delay unit, the PVT control circuit 110 may comprise a circuit as simple as a variable resistor or more complicated circuitry that generates a programmed delay value input to the delay unit.

FIG. 7 is a flowchart of the operation of the method of the invention. For an open-drain bus, the transmission line is normally pulled high by the pullup resistor unless actively pulled low using a switchable pulldown impedance device. Accordingly, the method begins assuming the transmission line is in a HIGH state. The method also assumes a series of predetermined pulldown impedance values and delay times associated with each step, whose values may optionally be adjusted (step 220 and step 222) to achieve a desired slew rate on the transmission line.

Upon detection of a transition of the data signal from the HIGH state to the LOW state (step 201), a first predetermined pulldown impedance associated with a first step in an ordered sequence of steps is connected (step 202) between the transmission line and the LOW voltage source. After delaying (step 203) a first delay time associated with the first step in the ordered sequence of steps, a determination is made (step 204) as to whether or not more steps exist in the ordered sequence of steps. If another step exists, a next predetermined pulldown impedance associated with a next step in the ordered sequence of steps is connected (step 205) between the transmission line and LOW voltage source. A next delay time associated with the next step then passes (step 206). Steps 204 through 206 are then repeated until no more steps in the ordered sequence of steps exist. At this point, the method is complete until detection of a transition of the data signal from the LOW state to the HIGH state (step 207).

Upon detection of a transition of the data signal from the LOW state to the HIGH state (step 207), a last predetermined pulldown impedance associated with the last step in the ordered sequence of steps is disconnected (step 208) from the transmission line. After delaying (step 209) a delay time associated with the last step in the ordered sequence of steps, a determination is made (step 210) as to whether or not more previous steps exist in the ordered sequence of steps. If a previous step exists, a next predetermined pulldown impedance associated with the previous step in the ordered sequence of steps is connected (step 211) between the transmission line and LOW voltage source. A next delay time associated with the previous step then passes (step 212). Steps 210 through 212 are then repeated until no more previous steps in the ordered sequence of steps exist. At this point, the method is complete until detection of a transition of the data signal from the HIGH state to the LOW state (step 201), where steps 202 through 206 are then repeated in the manner described previously.

The preferred embodiment of the invention has been described in terms of an open-drain bus which is normally in a HIGH state unless actively pulled to a LOW state using a variable pulldown impedance network. It will be appreciated that the principles of the invention may be applied similarly to a bus which is normally in a LOW state unless actively pulled to a HIGH state using a variable pullup impedance network. In this embodiment, the method would perform a stepwise decrease in pullup impedance as the signal transitions from the LOW state to the HIGH state, and a stepwise increase in pullup impedance as the signal transitions from the HIGH state to the LOW state.

The method may also be applied to a transmission line having separate pullup and pulldown drivers.

It will be appreciated that the invention allows precise control of the slew rate and shape of a transitioning signal on an integrated circuit transmission lien. By choosing the number of steps and selecting appropriate values for the impedance connected/disconnected to the transmission line at each step and the delay time between each step, the shape of the edges of the signal may be essentially "sculpted" by the designer. In addition, when the same delay time is selected between each step, the slew rate can be adjusted to compensate for process, voltage, and temperature variation across different integrated circuits simply by varying the delay time.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for controlling the slew rate of a signal on a node of an integrated circuit over a plurality of sequentially ordered steps each of which is associated with a corresponding respective impedance value, said node pulled to a first non-floating state by a first driver connecting said node to a first voltage source, and said node pulled to a second non-floating state by a second driver electrically connecting said node to a second voltage source through a variable impedance network, said method comprising:
  adjusting a delay time corresponding to one or more of said plurality of sequentially ordered steps to increase or decrease a rate at which said data signal transitions from said first non-floating state to said second non-floating state; and
  when a data signal to be output on said node transitions from said first non-floating state to said second non-floating state:
    repeating in order for each of said plurality of sequentially ordered steps:
      delaying said delay time associated with said step; and
      electrically connecting a predetermined impedance associated with said step between said second voltage source and said node.

2. A method in accordance with claim 1, wherein:
each said predetermined impedance in order of said ordered sequence of steps increases/decreases such that said data signal transitions linearly from said first non-floating state to said second non-floating state.

3. A method in accordance with claim 1, wherein:
each said predetermined impedance In order of said ordered sequence of steps increases/decreases such that said data signal transitions non-linearly from said first non-floating state to said second non-floating state.

4. A method in accordance with claim 1, wherein:
each said delay time corresponding to each said step of said ordered sequence of steps is substantially equal to each other of said delay time corresponding to each said step of said ordered sequence of steps.

5. A method in accordance with claim 1, wherein:
each said delay time corresponding to each said step of said ordered sequence of steps is different from each other of said delay time corresponding to each said step of said ordered sequence of steps.

6. A method in accordance with claim 1, comprising:
adjusting said delay time corresponding to each said plurality of sequentially ordered steps to account for process, voltage, and/or temperature variance of said integrated circuit.

7. A method in accordance with claim 1, comprising:
adjusting each said predetermined impedance corresponding to each said plurality of sequentially ordered steps to increase or decrease a rate at which said data signal transitions from said first non-floating state to said second non-floating state.

8. A method in accordance with claim 1, comprising:
adjusting each said predetermined impedance corresponding to each said plurality of sequentially ordered steps to account for process, voltage, and/or temperature variance of said integrated circuit.

9. A method in accordance with claim 1, comprising:
when a data signal to be output on said node transitions from said second non-floating state to said first non-floating state:
  repeating for each step in reverse order of said ordered sequence of steps:
    delaying a delay time associated with said step; and
    electrically disconnecting said predetermined impedance associated with said step from said node.

10. A method in accordance with claim 9, wherein:
each said predetermined impedance in order of said ordered sequence of steps increases/decreases such that said data signal transitions linearly from said first non-floating state to said second non-floating state.

11. A method in accordance with claim 9, wherein:
each said predetermined impedance in order of said ordered sequence of steps increases/decreases such that said data signal transitions non-linearly from said first non-floating state to said second non-floating state.

12. A method in accordance with claim 9, wherein:
each said delay time corresponding to each said step of said ordered sequence of steps is substantially equal to each other of said delay time corresponding to each said step of said ordered sequence of steps.

13. A method in accordance with claim 9, wherein:
each said delay time corresponding to each said step of said ordered sequence of steps is different from each other of said delay time corresponding to each said step of said ordered sequence of steps.

14. A method in accordance with claim 9, comprising:
adjusting each said delay time corresponding to each said plurality of sequentially ordered steps to increase or decrease a rate at which said data signal transitions from said first non-floating state to said second non-floating state.

15. A method in accordance with claim 9, comprising:
adjusting said delay time corresponding to each said plurality of sequentially ordered steps to account for process, voltage, and/or temperature variance of said integrated circuit.

16. A method in accordance with claim 9, comprising:
adjusting each said predetermined impedance corresponding to each said plurality of sequentially ordered steps to increase or decrease a rate at which said data signal transitions from said first non-floating state to said second non-floating state.

17. A method in accordance with claim 9, comprising:
adjusting each said predetermined impedance co responding to each said plurality of sequentially ordered steps to account for process, voltage, and/or temperature variance of said integrated circuit.

18. A circuit for controlling the slew rate of a signal on a node of an integrated circuit, comprising:
  a first driver which pulls said node to a first non-floating state by connecting said node to a first voltage source;
  a second driver which pulls said node to a second non-floating state, comprising:
    a variable impedance network programmable to switchably connect one of a plurality of predetermined impedances between said node and a second voltage source;
    a an adjustable delay circuit which receives a data signal and generates a plurality of delayed versions of said data signal said delay circuit adjusting a delay time corresponding to one or more of said plurality of delayed versions of said data signal in order to increase or decrease said slew rate of said signal on said node of said integrated circuit;
    a predriver circuit which receives said data signal and said plurality of delayed versions of said data signal, wherein:
      when said data signal transitions from said first non-floating state to said second non-floating state, said predriver circuit programs said variable impedance network to sequentially connect a different one of said plurality of predetermined impedances in ascending or descending order between said node and said second voltage source once for each successive delayed version of said data signal.

19. A circuit in accordance with claim 18, wherein:

said ascending or descending order of said plurality of predetermined impedances is non-linear to result in a linear slew rate of a resulting output signal on said node.

20. A circuit in accordance with claim 18, wherein:

said delay circuit comprises a plurality of serially connected delay units each receiving an input signal and each delaying a predetermined delay time and generating an output signal comprising a delayed version of said input signal, wherein a first delay unit receives said data signal and each successive delay unit receives said output signal of its predecessor delay unit.

21. A circuit in accordance with claim 20, wherein:

each said delay time of said respective plurality of delay units are substantially equal.

22. A circuit in accordance with claim 20, wherein:

each said plurality of delay units are adjustable to set its respective delay time to increase or decrease said stew rate.

23. A circuit in accordance with claim 22, comprising:

a PVT control circuit connected to adjust said plurality of delay units to account for PVT variance of said integrated circuit.

24. A circuit in accordance with claim 21, wherein:

when said data signal transitions from said second non-floating state to said first non-floating state, said pre-driver circuit programs said variable impedance network to disconnect a different one of said plurality of predetermined impedances in reverse of said ascending or descending order between said node and said second voltage source once for each delayed version of said data signal.

25. A circuit in accordance with claim 18, comprising:

a PVT control circuit connected to said delay circuit to adjust said delay times corresponding to said one or more of said plurality of delayed versions of said data signal to account for PVT variance of said integrated circuit.

* * * * *